United States Patent [19]
Fisher et al.

[11] 4,256,390
[45] Mar. 17, 1981

[54] CATHODE RAY TUBE SCREEN EXPOSURE SYSTEM

[75] Inventors: Gary J. Fisher, Emporium; James E. Morean, Coudersport; Perley F. Simmons; Steven N. VanGorden, both of Emporium, all of Pa.

[73] Assignee: GTE Products Corporation, Stamford, Conn.

[21] Appl. No.: 132,068

[22] Filed: Mar. 20, 1980

[51] Int. Cl.³ .............................................. G03C 5/00
[52] U.S. Cl. ....................................................... 354/1
[58] Field of Search ............................................. 354/1

[56] References Cited
U.S. PATENT DOCUMENTS

| | | | |
|---|---|---|---|
| 3,259,038 | 7/1966 | Burdick et al. | 354/1 |
| 3,890,151 | 6/1975 | Suzuki et al. | 354/1 X |
| 4,050,080 | 9/1977 | Pawlikowski et al. | 354/1 |
| 4,122,461 | 10/1978 | Morean et al. | 354/1 |

Primary Examiner—Donald A. Griffin
Attorney, Agent, or Firm—Theodore D. Lindgren

[57] ABSTRACT

The invention relates to an improvement in the photo-exposure system utilized in the forming of stripe-patterned screens on the viewing panels of color cathode ray tubes. The versatile system incorporates an adjustable electronically controlled cam arrangement for achieving desired oscillation of the exposure light source. A cam associated multi-apertured control disk initiates a pre-determined number of pulses which accurately control the degree of cam movement and resultant light source oscillation.

10 Claims, 6 Drawing Figures

CATHODE RAY TUBE SCREEN EXPOSURE SYSTEM

TECHNICAL FIELD

This invention relates to the photo-exposure system utilized in forming cathode ray tube (CRT) screens and more particularly to electronically controlled cam means for oscillating the source of radiant energy employed in the system.

BACKGROUND ART

Color cathode ray tubes utilized for picture image reproduction, such as in television applications and similar display media, conventionally utilize electron gun structures which provide a plurality of related electron beams to produce the desired display imagery. In operation, the modulated electron beams are scanned across the screen of the tube to provide electron impingement upon selected color-emitting phosphor areas comprising the patterned screen disposed on the inner surface of the viewing panel of the tube, whereupon the transmitted color display is reproduced. Color picture tubes of this type usually employ a multi-opening grid, mask, or other type of negative structure which is interposed between the electron gun assembly and the screen structure to provide either masking of the screen, or deflection or focusing of the electron beams thereat.

In a conventional color cathode ray tube, the electron responsive screen is usually comprised of a repetitive pattern of multitudinous dot, bar or stripe formations of various phosphor materials capable of emitting, for example, green, red and blue color luminescence upon electron beam impingement. In certain tube constructions, the pattern of phosphors comprising the screen is disposed to overlay an array of multitudinous window areas of an opaque screen matrix formed on the viewing panel. The shapings of the matrix windows and the associated color phosphor patterns constituting this type of screen structure are formed in accordance with the number of electron beams utilized and with the discrete mask openings and operative characteristics of the mask or grid structure employed in the respective tube.

Since a vast number of color phosphor groups are required to produce a high resolution display of desired color purity, the process employed in forming both the basic window matrix, and the associated phosphor screen, must be one that is capable of accurately forming a multitude of similar pattern elements in the screen arrangement. In a preferred method for fabricating the screen structure of a color tube, a photo printing technique is utilized wherein the viewing panel of the tube, having an interior coating of a photosensitive resist composition disposed thereon, is suitably photoexposed through a related negative or multi-opening mask by radiant energy means incorporated into the exposure system. Subsequent development of the numerous selectively exposed areas on the panel, produces either a first window pattern of the matrix, or in proper sequence, the associated superimposed first color phosphor pattern of the subsequently formed screen. Such photo exposure is repeated in the proper steps to form the remaining windows in the matrix and likewise to later effect deposition of the respective color-emitting phosphors associated therewith to complete fabrications of the patterned screen.

Of particular interest in this instance, is the fabrication of a tri-color screen associated with a color tube wherein the three electron guns are positioned in substantially in-line horizontal orientation, i.e., the center gun being substantially on the central axis of the tube with a remaining gun offset on either side thereof. A conventional screen for the in-line tube is one having a pattern of a multiplicity of vertical phosphor stripes, either with or without a separation matrix of narrow spaced apart opaque lines.

Associated with the vertically striped screen, disposed on the curvature of the panel, is a spatially related negative member such as a multi-opening slotted mask in the form of a slightly domed structure having a multitude of elongated openings or windows, arranged in vertical columns separated by a sufficient interstitial webbing of mask material to provide structural rigidity to the member. Thus, in this type of mask structure each vertical column of openings evidences a number of structurally separating horizontal bridge elements in addition to the integrally inherent vertical column separation material.

In separately producing either the windowed matrix pattern or the related superimposed array of electron responsive phosphor stripes, the photo-exposure system usually comprises a discrete light source to provide the actinic radiant energy necessary for the photodeposition procedure and an associated light permeable refractive medium. For the deposition of one pattern of stripes, the exposure system is positioned to substantially coincide with the central axis of the screen or panel.

The two remaining stripe patterns are achieved by shifting the exposure system horizontally to either side of the central axis. By this procedure, the resultant multi-striped screen elements are oriented to be impinged by the proper electron beams subsequently emanating from the horizontally positioned electron guns in the tube.

To photo-expose a screen pattern of continuous vertical stripes of the respective color emitting phosphor materials, by using the aforedescribed slotted mask having the horizontal bridge elements between openings, it has been found beneficial to utilize an elongated source of radiant energy positioned in a manner to be substantially parallel with the vertical columns of elongated openings in the mask. One common source of exposure radiation has been a tube-like mercury vapor lamp evidencing an incandescent arc of substantially elliposidal or elongated shaping. Such illumination, in conjunction with the light permeable refractive medium in the system, radiates a flood of actinic exposure radiation over the whole of the multi-opening mask. Moving or oscillating the light source in a linear path substantially parallel to the vertical columns of mask openings effectively increases the longitudinal source of illumination, thereby supplying exposure radiation around and under the mask bridgings. Thus, by this oscillatory motion of the light source, the shadowing of the light sensitive screen, by the horizontal interspatial bridging elements, is substantially eliminated and a screen pattern of vertical continuous stripes results.

While the oscillation of the source of exposure radiant energy is effectively realized by a motorized cam arrangement, it has been found that the amount and rate of reciprocating motion is not uniform for the fabrication of screens on the various sizes of tube viewing panels. The area of exposure, the shapings of the mask openings and interstitial webbing, the mask to panel spacing, mask and panel curvatures and other exposure considerations are all important factors to be considered in determining the amount and rate of oscillation of the exposure light source. In a properly exposed screen, the stripe patterns should be free of bridge element shadowings manifest as necked-down areas in the stripes. Thus, it was found necessary to make numerous time-consuming cam changes to finally obtain the proper set-up oscillatory stroke length for achieving correct exposure for the respective viewing panels of differing tube sizes.

DISCLOSURE OF INVENTION

The present invention is addressed to an improvement in the exposure system for expeditiously photoforming stripe-patterned screens on the respective viewing panels of various sizes for in-line gun color cathode ray tubes utilizing slotted-mask structures.

The improved exposure system utilizes a control disk having a fixed center shaft and evidencing a planar area wherein a vast number of similar equi-spaced index apertures are arranged in an arcuate linear manner near the periphery thereof. In addition the disk has at least one control aperture oriented near the linear arrangement of index apertures. A cam of discretely shaped contour is affixed to the center shaft adjacent the control disk. Also attached to the center shaft is a motor with speed reducing means. A cam-related slide and support means accommodates a source of radiant exposure energy and enables a reciprocating movement to be imparted thereto by a cam follower mated to the aforementioned cam. A photo-sensing reset probe is located adjacent the control disk at a position to respond to discretely associated light energy beamed through the disk control aperture. Another photo-sensing unit functioning as an index probe is oriented at a location adjacent the disk, but spatially removed from the reset probe, at a position to respond to discretely associated light energy beamed through the index apertures as they move sequentially therethrough. The motor and respective photo-sensing probes are connected to electric power source means and associated electronic control circuitry which includes adjustable index counting means and related switching control means. These circuitry means effect controlled rotary movement of the motor, disk and cam with accompanying repetitive reversal of directional rotation thereof. Thus, an accurately controlled reciprocatory movement is imparted to the slide and the desired oscillation of the exposure light source is expeditiously achieved. Setting of the index counting means, which determines the exact travel of the disk and related cam is an adjustment easily and quickly achieved. Accordingly, the invention adds advantageously versatility to the exposure system by drastically reducing the need for changing of cams.

BRIEF DESCRIPTION OF THE DRAWINGS

FIG. 2a is an enlarged section of the multi-opening slotted mask oriented within the viewing panel and noted in FIGS. 1 and 2;

FIG. 3a is a partial perspective showing an embodiment of combined components in the mechanism.

BEST MODE FOR CARRYING OUT THE INVENTION

For a better understanding of the present invention together with the advantages and capabilities thereof, reference is made to the following specification and appended claims in connection with the aforedescribed drawings.

Figure 1:
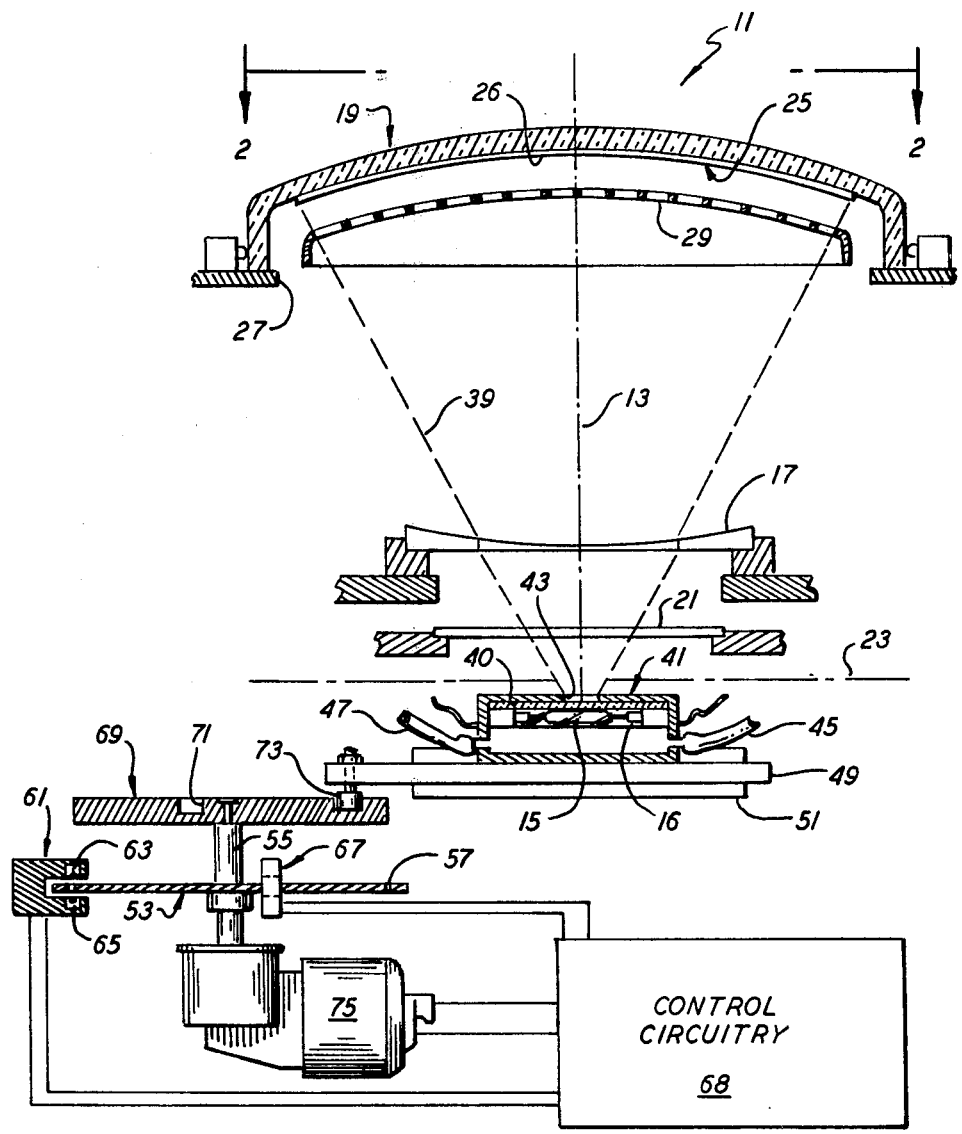
FIG. 1 is a partially sectioned elevation of a CRT screen exposure system wherein the invention is incorporated.

With reference to the drawings, there is shown in FIG. 1 the rudiment portions of a color cathode ray tube screen exposure system 11, or lighthouse structure, wherein the invention is embodied. As noted, the system evidences a central axis 13 and includes a linear source of exposure energy 15 from which actinic radiation is directed through a light permeable refractive medium or lens 17 and thence to the region of the viewing panel 19.

If desired, the system may include a light attenuating element or graded filter means 21 to selectively modify the exposure radiation. In some instances, a configuration of a thin coating gradient of light attenuating material is discretely disposed on a surface of the lens 17. Also, a shutter or light shut-off means is usually included, but is not shown in the drawings as such structure is not essential to the operation of the invention. Orientation of such shutter means is substantially in plane 23.

While both a windowed matrix and a conjunctive screen pattern are photo-exposed in related manners, in this instance, for purposes of simplicity, the exposure of a striped-patterned screen 25 will be described as exemplary of the photo-exposure technique.

Suitably positioned on receptive opening means 27 in the exposure system 11 is a substantially rectangular cathode ray tube viewing panel 19 having a photoresist composition disposed on the inner surface thereof to form the basic coating for the screen 25. Oriented within the panel 19, and spaced from the screen is a multi-opening slotted mask member 29 through which exposure radiation 39, from source 15, is directed to form a patterned array of exposed areas on the light-sensitive screen coating therebeneath.

Figure 2:
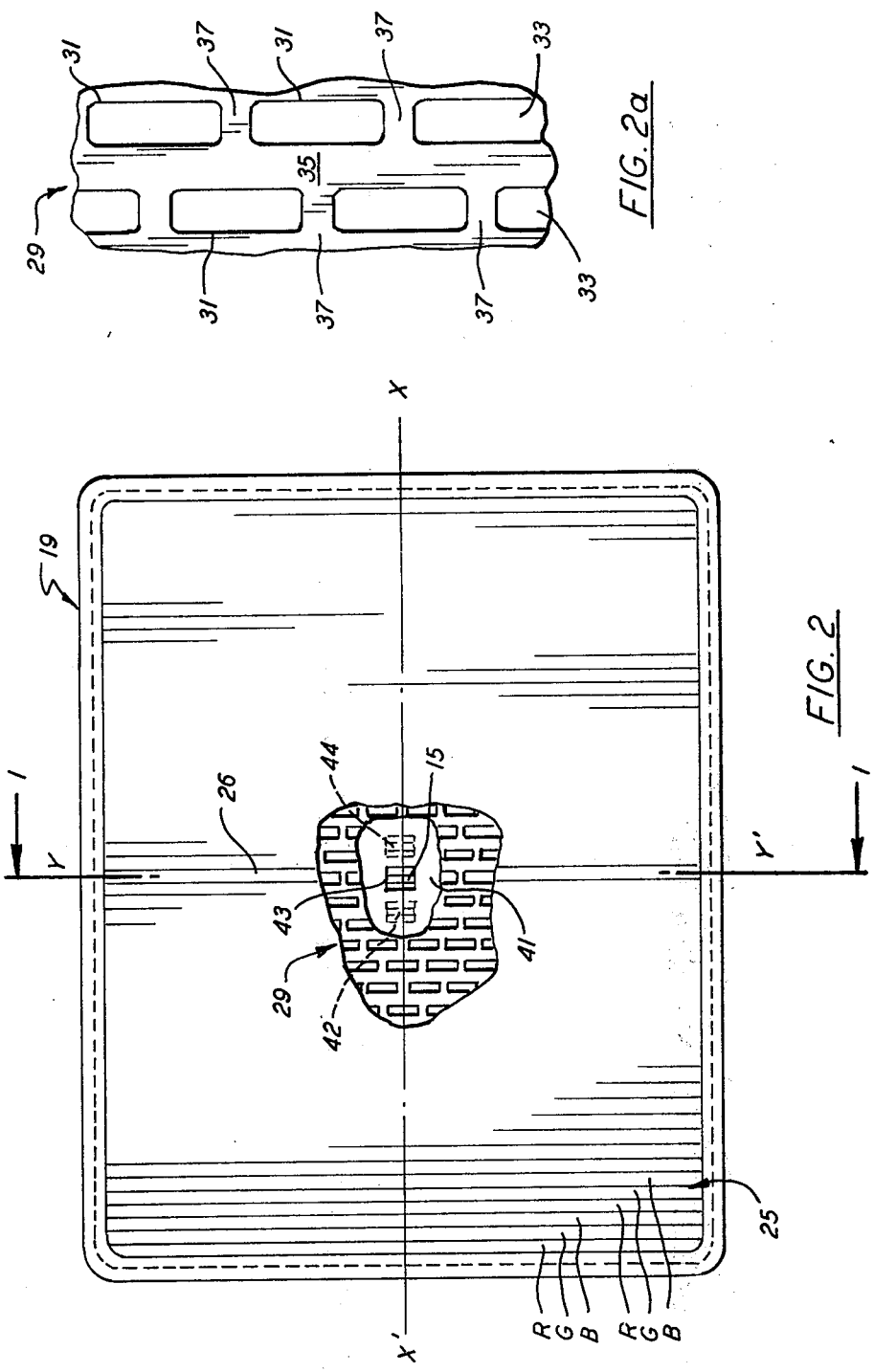
FIG. 2 is a plan view looking into the viewing panel shown in FIG. 1, taken along the line 2—2, and illustrating cut-away portions thereof.

The exemplary slotted mask member 29, as detailed in FIGS. 2 and 2a, is a webbed structure having a multitude of elongated openings or windows 31 disposed therein. These openings are arranged in an array of vertical columns 33 and separated by a sufficient interstitial webbing of material to provide stuctural rigidity to the mask. As shown, each vertical columns of openings 33 contains a number of horizontal bridging elements 37 which are integrally joined with the column separation material to form the definitive interstitial webbing 35.

Figure 3:
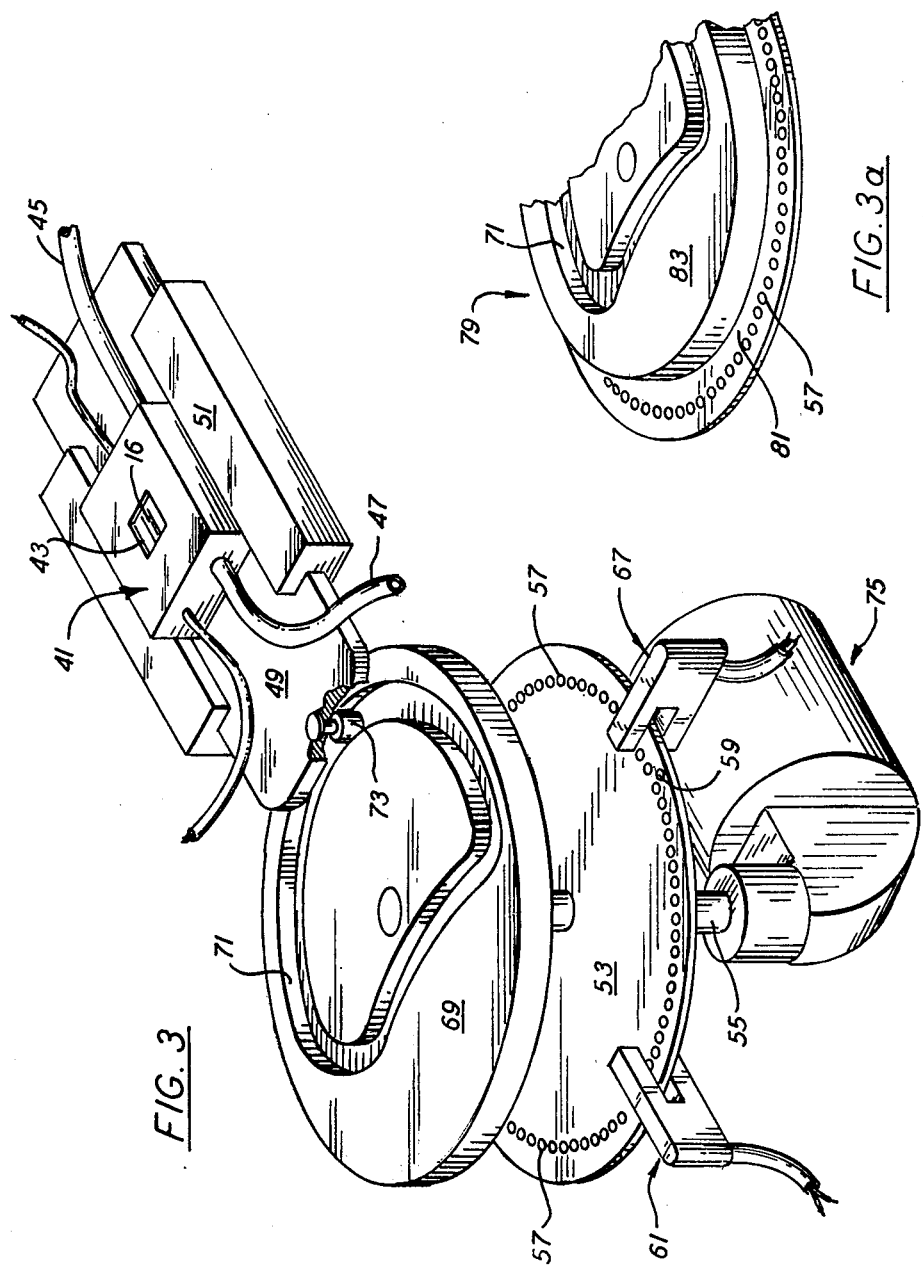
FIG. 3 is a perspective view of the oscillation mechanism shown in FIG. 1.

With reference to FIGS. 1, 2 and 3 in greater detail, there is shown a water-tight exposure light source enclosure 41 having a light-exiting aperture 43 therein covered by a transparent optical glass component 40. Positioned directly therebeneath is the source of exposure radiation 15, such as the elongated luminescent arc of the liquid cooled mercury vapor lamp 16. The cooling liquid, such as deionized water, is conveyed to and from the enclosure 41, from an external supply system, by hose conductors 45 and 47. The light source enclosure 41 is mounted on slide means 49 which is accommodated in companion slide support means 51. Reciprocating movement or linear oscillation is aptly supplied to the slide means by controlled cam means to be subsequently explained.

As portrayed in FIG. 2, the panel 19, in this instance, is rectangular in shape and evidences a horizontal x-x' axis and a vertical y-y' axis. The vertically striped screen 25 is ultimately comprised of an exemplary pattern of a repetitive sequence of red (R), blue (B), and green (G) color emitting phosphor stripes which are parallel with the y-y' axis of the panel. The sequence of color manifestations is not necessarily in the order stated. As illustrated, the exposure system is oriented to form the pattern of the center stripes of the tri-stripe deposition. As such, the exposure radiation 15, being defined by aperture 43 in light source enclosure 41, being substantially on center, is linearly oscillated in a manner parallel with the y-y' axis and beamed through the columns of the vertically oriented mask openings 31 to produce a series of continuous stripes of photo-exposed material. One illustrative stripe of the pattern array is indicated as the substantially on-axis deposition 26. The side disposed striped elements of the tri-stripe pattern are formed by shifting the exposure system 11 substantially along the x-x' axis to positions on either side of the first exposure location. Such positionings are noted in phantom in FIG. 2 as 42 and 44 respectively.

Figure 4:
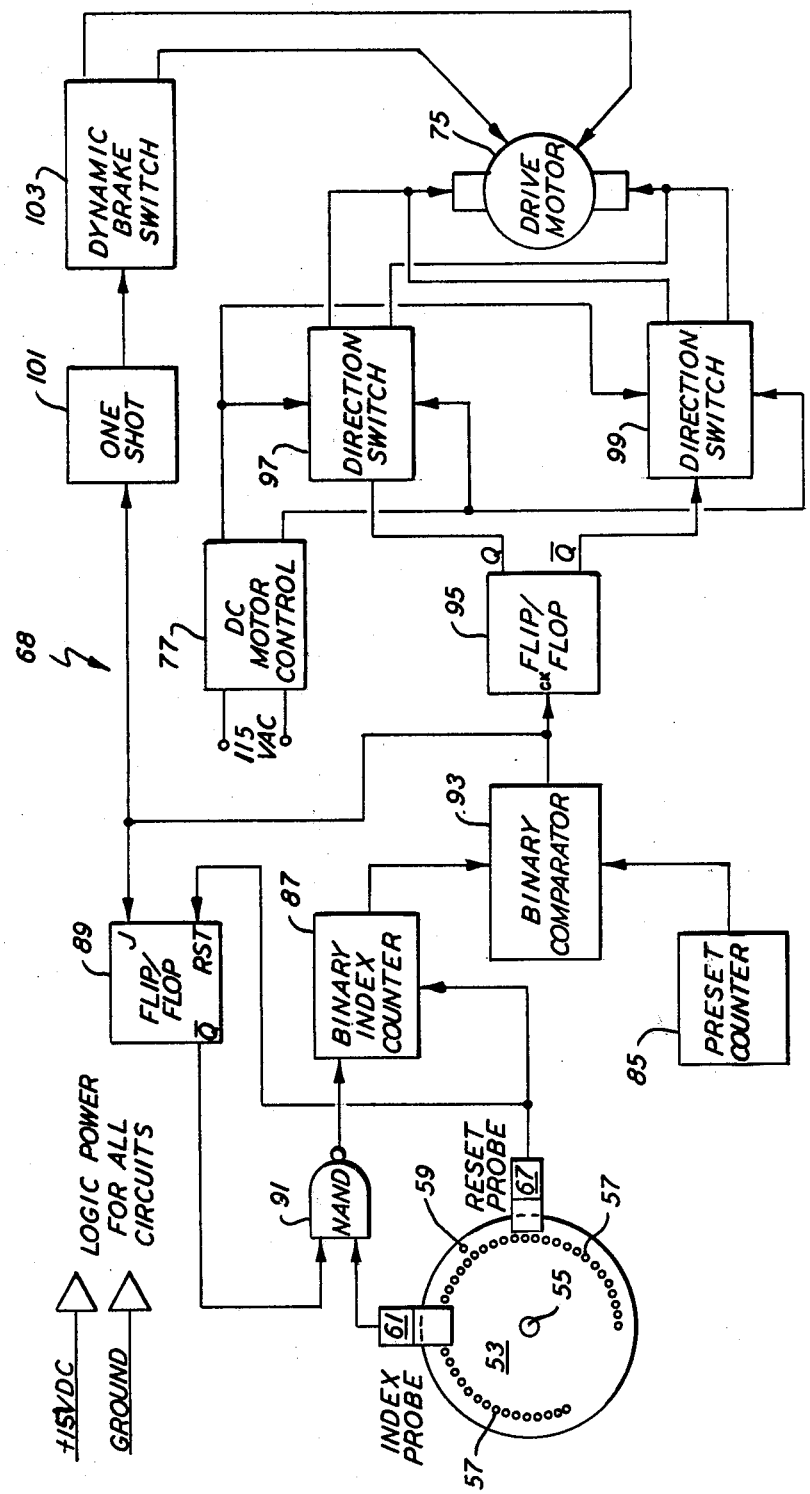
FIG. 4 is a schematic detailing circuitry for operating and controlling the invention.

The mechanism, for effecting and controlling the previously mentioned cam-initiated oscillatory movement of the slide means 49, is comprised of a substantially planar control disk 53 formed of rigid metallic or plastic material. This disk is affixed to a center drive shaft 55, and has formed therein a multitude of similar equi-spaced index apertures 57 arranged in an orderly linear arcuate manner near the periphery thereof. The disk also contains at least one control aperture or discrete opening 59 which is formed therein near the linear arrangement of index apertures 57 at a location substantially representing the mid-point of the index arrangement but removed from the arcuate linearity thereof. Such is shown in FIGS. 3 and 4. By way of illustration, the useful index or counting apertures 57 are encompassed within an arcuate range not exceeding substantially 300 degrees. For example, a control disk, of six inch diameter, evidences 200 index apertures 57 in 270 degrees of rotation. The bores of such apertures are in the order of 0.046 inches, and the associated mid-oriented control aperture 59 may be of like dimensioning.

The index apertures 57 are read by an index probe 61 in the form of a photo-sensing unit containing a light source 63 and an electronic receptor 65. This probe is positionally adjustable on independent support means, not shown, adjacent the periphery of the disk 53. The construction of the probe permits the peripheral area of the disk to move freely therethrough. The probe is so aligned that radiation from the associated light source 63 is beamed through the moving index apertures 57 and received as intermittent counting pulses by the receptor 65.

In a related manner, the control aperture 59 is read by a reset probe 67 which is a similar photosensing unit containing a light source and electronic receptor. This probe is likewise positionally adjustable on independent support means, not shown, adjacent the periphery of the disk 53. Construction of the reset probe allows the periphery of the disk to move freely therethrough, and is aligned in a manner whereby radiation from the contained light source is beamed through the moving control aperture 58 and received as a reset pulse by the associated receptor in the probe. The pulses from this unit initiate the counting sequence of index apertures in each direction of oscillation. The respective pulses from the individual index and reset probes are fed into the control circuitry 68 as will be explained.

Associated with the control disk 53 is a cam member 69 in the form of a plate affixed to the drive shaft 55 at a position adjacent the control disk. This member exhibits a definitive functioning surface 71 formed of a discrerely shaped contour, as for example a definitive groove recessed therein.

Related cam follower means 73, being attached to aforedescribed slide means 49, is formed and positioned to mate the cam contour 71. This cam follower transfers cam-initiated action into reciprocating movement or oscillation to the slide means and the source of exposure energy 15 oriented thereon.

The definitive surface 71 of the cam is contoured as a substantially quasi-heart shaped positive action configuration having substantially equal rise and return slopes and a substantially zero center dwell at the apex thereof. For example, a cam surface providing a constant velocity curve of 1.500 inches in 270 degrees of rotation will impart, through the cam follower, 0.010 inches of movement to the slide means 49 for each 1.8 degrees of cam rotation, such being the control effected by each index aperture in the aforementioned control disk. Thus, a very accurate control of oscillation is achieved.

Since control disk 53 and cam member 69 are adjacently positioned and affixed to the common drive shaft 55, it is within the scope of the invention to combine the disk and cam into an integrated cam-control member 79 as shown in FIG. 3a. In the combined embodiment, the control disk 81 extends as a ledge from the cam body member 83, and contains the control and index apertures as previously described.

Power drive means 75 connected to drive shaft 55 for operating the described oscillation mechanism may be, for example, a 1/50 HP 115 VDC motor with an integral speed reducer and a control unit 77.

Exemplary electrical circuitry for effecting and controlling the desired oscillation of the radiant energy source in the improved screen exposure system 11 is schematically shown in FIG. 4.

For typical operational sequence of the exposure system, reference is directed to FIGS. 1, 3 and 4. The desired oscillation of exposure lamp 16 is translated to cam movement which is directly related to a definite number of index apertures 57 in the control disk 53. Whereupon, the preset counter 85 is set for the prescribed number of apertures. Upon activation of the system, the drive motor 75 begins rotation of the control disc 53 thereby moving the mid-position control aperture 59 to the reset probe 67, whereupon the light initiated pulse emanating from the reset probe functions to reset the binary index counter 87 to zero, and simultaneously opens the circuit to the index probe 61 by resetting the index flip-flop 89. The motorized control disk 53 and associated cam 69 begin rotating in a clockwise direction, whereupon the pulses from the index probe 61 are routed through gate 91 to the binary index counter 87, where they are received and counted. When the number of indexes set on the preset counter 85 equals the index pulses sent from the index probe 61 to the binary index counter 87, as determined by the binary comparator 93, a pulse is sent from the binary comparator which performs three related functions: (a) the motor control flip-flop is toggled activating the proper directional switch 97 or 99 thereby changing the direction of motor rotation; (b) concurrently, a motor braking pulse, of for example, 50 MS duration, is triggered through one shot multivibrator 101 to the motor dynamic braking switch 103; and (c) at the same time, the index flip-flop 89 is reset to disable the index probe 61. Thus, the motor 75 momentarily stops, changes to a counter clockwise rotation, and thence moves the control aperture in the disk 53 to the reset probe 67, whereupon the activating pulse therefrom initiates a repeat counting of the index apertures in the opposite direction, via pulses from index probe 61, to complete the remaining half of the oscillation. This reciprocal cycling is automatically repeated until the system is switched off.

While there has been shown and described what are at present considered the preferred embodiments of the invention, it will be obvious to those skilled in the art that various changes and modifications may be made therein without departing from the scope of the invention as defined by the appended claims.

INDUSTRIAL APPLICABILITY

The aforedescribed improvement in the exposure system for photo-forming a stripe-patterned screen for a color cathode ray tube has expeditious utilization in the manufacturing procedure. In an efficient manner, the versatile system enables the achievement of the required oscillation of the exposure light source through a predetermined distance, such being facilely and accurately adjustable in minute increments of electronically controlled cam travel. The improved system eliminates the need for stocking a variety of cams, and the time-consuming change-over time necessary for effecting the cam changes, which were required for setting up the exposure system for different size viewing panels. The improved versatility of the system is a marked advancement in color CRT screen exposure.

We claim:

1. An improvement in an exposure system for photo-forming a stripe-patterned screen for an in-line gun color cathode ray tube, said system utilizing a defined linear source of radiant energy for selectively photoexposing the sensitized inner surface of the tube viewing panel through a spatially related multi-opening mask member and a conjunctively positioned light refractive medium, said improvement relating to adjustable means for predeterminately oscillating said source of radiant energy, said means comprising:

a substantially planar control disk having a fixed center shaft therethrough, and evidencing a multitude of similar equi-spaced index apertures arranged in an orderly arcuate linear manner near the periphery thereof, and at least one control aperture oriented near said linear arrangement of index apertures but not in linear relationship therewith;

a positionally-adjustable reset probe in the form of a photo-sensing unit oriented at a location adjacent said disk to respond to associated light energy beamed through said disk control aperture thereby providing controlling electronic pulses;

a positionally-adjustable index probe in the form of a photo-sensing unit oriented at a location adjacent said disk spatially removed from said reset probe, said index probe being in a position to respond to associated light energy beamed through said index apertures as they move thereacross thereby providing index electronic pulses;

a cam member associated with said control disk and affixed to said center shaft at a position adjacent said control disk, said member having a definitive surface of discretely shaped contour;

cam follower means formed to mate with said cam contour in a manner to translate cam motion into reciprocating movement;

slide means and companion support means positioned relative to said cam follower and fashioned to accommodate said source of radiant energy, said slide being attached to said cam follower means to receive the reciprocating movement imparted therefrom;

motor means attached to said center shaft to provide a degree of rotary motion thereto; and electric power source means and associated electronic control circuitry, said circuitry reading the input of said controlling and index electronic pulses from said probes with reference to adjustable index counting means and related switching control means, said circuitry effecting controlled rotary movement of said motor and related disk and cam members with repetitive reversal of directional rotation thereof, thereby achieving predetermined oscillation of said radiant energy source.

2. The improvement in the cathode ray tube screen exposure system according to claim 1 wherein said tube viewing panel has both vertical and horizontal axes thereacross, and wherein the direction of oscillation of said radiant energy source is substantially parallel to said vertical axis.

3. The improvement in the cathode ray tube screen exposure system according to claim 1 wherein said cam member is a plate having a cam contour formed as a groove therein.

4. The improvement in the cathode ray tube screen exposure system according to claim 1 wherein said cam contour is substantially quasi-heart shaped in configuration having substantially equal rise and return slopes and a substantially zero center dwell at the apex thereof.

5. The improvement in the cathode ray tube screen exposure system according to claim 1 wherein said radiant energy source is an elongated arc oscillated in a linear longitudinal path.

6. The improvement in the cathode ray tube screen exposure system according to claim 1 wherein said control circuitry has adjustable counting means to correspond to the rotation of a pre-set number of index apertures in said control disk, and wherein the discrete pre-setting of said counting means determines the length of stroke of said cam-initiated reciprocal movement of said slide.

7. The improvement in the cathode ray tube screen exposure system according to claim 1 wherein at the time of initiatory operation said reset probe is centered on said disk control aperture, and said index probe is centered on one of said index apertures.

8. The improvement in the cathode ray tube screen exposure system according to claim 1 wherein the control aperture in said control disk is substantially at midpoint relationship to the linear arcuate array of said index apertures therein.

9. The improvement in the cathode ray tube screen exposure system according to claim 1 wherein the array of usable index apertures in said control disk are encompassed within an arc not exceeding substantially 300 degrees.

10. The improvement in the cathode ray tube screen exposure system according to claim 1 wherein said control disk and said cam member are associated as a combined embodiment, the peripheral area of said control disk extending as a ledge from said cam member.

* * * * *